United States Patent

[11] 3,609,477

[72] Inventors Karsten E. Drangeid
Hedingen;
Theodor O. Mohr, Gattikon, Switzerland;
Horst F. Statz, Peekskill, N.Y.; Waldemar
Von Muench, Aachen, Germany

[21] Appl. No. 720,648
[22] Filed Apr. 11, 1968
[45] Patented Sept. 28, 1971
[73] Assignee International Business Machines Corporation Armonk, N.Y.
[32] Priority Apr. 18, 1967
[33] Switzerland
[31] 5508/67

[54] SCHOTTKY-BARRIER FIELD-EFFECT TRANSISTOR
3 Claims, 10 Drawing Figs.

[52] U.S. Cl. .......... 317/235 R, 317/235 A, 317/235 UA, 317/235 AG, 317/235 AM
[51] Int. Cl. .......... H01o 11/14
[50] Field of Search .......... 317/235 (21), 235 (21.1), 235 (21.3), 235 (31)

[56] References Cited

UNITED STATES PATENTS

| | | | |
|---|---|---|---|
| 3,405,331 | 10/1968 | Skalski et al. | 317/235 |
| 3,414,782 | 12/1968 | Lin et al. | 317/235 |
| 3,177,100 | 4/1965 | Mayer et al. | 148/175 |
| 3,263,095 | 7/1966 | Fang | 307/88.5 |
| 3,453,504 | 7/1969 | Compton et al. | 317/235 |
| 3,114,867 | 12/1963 | Szekely | 317/235 |
| 3,289,054 | 11/1966 | Haering et al. | 317/235 |
| 3,316,131 | 4/1967 | Wisman | 317/235 |

OTHER REFERENCES

Leonard " Decreasing Stability" IBM Technical Div. Bul. Vol. 9, No. 2 July, 1966 p. 211

Ames " Field Effect Transistors" IBM Technical Div. Bul. Vol. 9, No. 10 Mar. 1967 p. 1470

*Primary Examiner*—Jerry D. Craig
*Attorneys*—Hanifin and Jancin and Bernard N. Wiener

ABSTRACT: A Schottky-barrier field-effect transistor is disclosed with a semiconductor channel of relatively low conductivity between the source and drain electrodes which may be electrically influenced by a Schottky-barrier gate electrode located on the semiconductor channel. The transistor is characterized by a zone or region of higher conductivity which extends from the vicinity of the source electrode to near the gate electrode. Further, source and drain regions are conveniently provided for the transistor of semiconductor of the same conductivity type as the channel semiconductor at the Schottky-barrier electrode. Advantageously, the drain region may be made of semiconductor of high conductivity and the same conductivity type as the source region. The high conductivity region may be achieved through either diffusion or epitaxial growth technique.

INVENTORS
KARSTEN E. DRANGEID
THEODOR O. MOHR
HORST F. STATZ
WALDEMAR VON MUENCH

BY Bernard N. Wiener
ATTORNEY

SCHOTTKY-BARRIER FIELD-EFFECT TRANSISTOR

This invention relates to a field-effect transistor and the procedure for making same. In particular, the invention relates to a field-effect transistor having a high transconductance suitable for use at high signal frequencies. Further, the invention relates to a field-effect transistor with a Schottky-barrier contact gate.

There are three known versions of the field-effect transistor, also called unipolar transistor. The version with the hitherto largest acceptance is the field-effect transistor with insulated gate. It has recently been shown that the other two versions, the Shockley-type field-effect transistor with PN junction gate and the field-effect transistor with Schottky-barrier gate have properties making them suitable for use at very high signal frequencies. One important factor in many high-frequency applications is the transconductance of the transistor. Transconductance is the ratio of change of current flowing through the transistor to the change of control voltage influencing the current. Several ways have already been indicated to improve the transconductance of field-effect transistors. As will be explained, the transconductance depends, among other factors, on the ohmic resistance appearing between source electrode and gate of the field-effect transistor. Several proposals have been made to reduce this resistance. Most successful hitherto has been the proposal to reduce the geometric distance between source and gate in order to obtain a low resistance. However, that proposal has serious limitations because manufacture of transistors is more difficult, and therefore more expensive, the smaller the distances between electrodes become. Usual procedures of photoetching, masking, etc. do not go below a certain distance. Further, extremely small distances between electrodes are undesirable because the voltage difference between source and gate electrode may come close to the breakdown voltage; and this would make the use of the transistor at conventional voltages difficult and perhaps impossible.

OBJECTS OF THE INVENTION

It is an object of this invention to provide a field-effect transistor which has a very low resistance between source and gate region.

It is a further object of this invention to provide a field-effect transistor having a high breakdown voltage between gate and drain.

It is a further object of this invention to provide a field-effect transistor having low resistance between source and gate region, but with a high breakdown voltage between the corresponding electrodes.

It is a further object of this invention to provide a field-effect transistor which can be manufactured by an easily variable procedure so that simple modifications during the manufacture result in essential alterations to the properties of the produced transistor.

It is a further object of this invention to provide a procedure for making such a field-effect transistor.

The foregoing and other objects, features, and advantages of the invention will be apparent from the following more particular description of preferred embodiments of the invention, as illustrated in the accompanying drawings.

According to the invention, the mentioned objects are achieved by a field-effect transistor having at least a source electrode, a gate electrode, and a drain electrode. The source and drain electrodes are interconnected by a channel of relatively low conductivity which may be electrically influenced by the gate electrode. The transistor is characterized by a zone of high conductivity which extends at least from the vicinity of the source electrode to near the gate electrode. The gate electrode is a Schottky-barrier type.

The invention will now be explained with reference to several embodiments.

Figure 1:
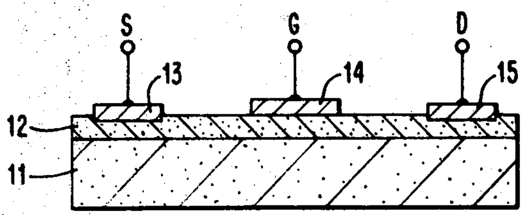
FIG. 1 (PRIOR ART)
FIG. 1 is a cross-sectional view of a conventional Schottky-barrier field-effect transistor.

FIG. 1 shows a cross-sectional view, taken along the direction of current flow, of a conventional Schottky-barrier field-effect transistor. The semiconductor channel with typical thickness of 0.2 to 1 microns arranged in the form of a lightly doped layer 12, doped typically with $10^{15}$ to $10^{17}$ carriers/cm.$^3$, on a suitable substrate 11. The channel 12 can be either N-type or P-type semiconductor. However, for convenience of discussion, the channel is described herein as being N-type semiconductor. Unless otherwise specified herein, the substrate 11 can be semiinsulating semiconductor, a semiconductor of opposite conductivity type to that of the channel, or an insulator, e.g., sapphire. The layer 12 can either be grown epitaxially on insulator or semiconductor substrate 11 or established by diffusion of doping material into semiconductor substrate 11. The layer 12 bears a source electrode S which is connected to semiconductor layer 12 by an ohmic contact 13. A gate electrode G is connected at 14 to layer 12 preferably by a Schottky-barrier contact. Further, there is a drain electrode D arranged on layer 12 by an ohmic contact 15.

In operation of the prior art Schottky-barrier transistor of FIG. 1, the current between source and drain may be influenced by a voltage connected to the gate. The amount of influence is usually expressed by the transconductance of the transistor. Neglecting the ohmic resistance between source and gate, the transconductance $g_o$ of a Schottky-barrier field-effect transistor is calculated according to the expression:

$$g_0=(A/\rho L)(1-\sqrt{-V_g/V_0}) \qquad (1)$$

where $g_0$ is the transconductance of the device, $\rho$ is the specific resistance of the channel in Ω cm., L is the length of the channel in cm., $V_g$ is the gate voltage in $V$, and $V_0$ is the pinchoff voltage, i.e., the voltage which blocks current flow in the field-effect transistor, and A is the cross section of the channel in cm.$^2$ in direction of current flow. The maximum transconductance $g_0$ (max) is obtained at $V_g=0$, i.e., $g_0$ (max) is the conductance of the channel when the channel is completely open.

In practice, the ohmic resistance $R_s$ in the channel 12 between source S and the gate region is not negligible and has to be considered when computing the corrected transconductance $g_m$. This can be done by using the expression: $g_m=g_0/(1a8+g_0R_s)$ (2)
Further, because the effective voltage $V_g$ is changed by the voltage drop between source and gate, the expression (1) is corrected by writing $-V_g+IR_s$ instead of $-V_g$ alone, where I is the current flowing through the transistor in $A$. o o The distance between source and gate has usually been about the size of the gate length, e.g., approximately 5 microns or smaller. Therefore, $R_s$ approximates the resistance of the open channel underneath the gate, i.e., $R_s \sim 1/g_0$ (max). It is apparent from expression (2) that the maximum transconductance is reduced by a factor of two due to the resistance between source electrode and gate region.

Figure 2:
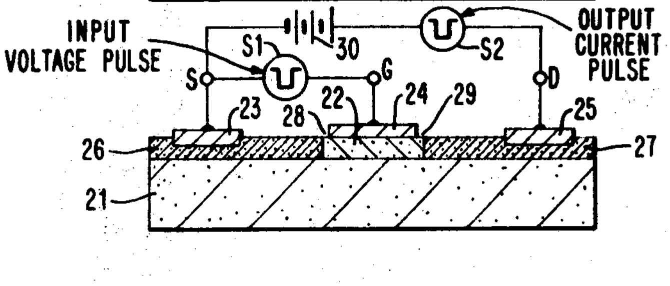
FIG. 2 is a cross-sectional view of a Schottky-barrier field-effect transistor designed according to this invention.

FIG. 2 illustrates a first embodiment of this invention in which the source gate resistance is significantly reduced compared to the prior art to obtain a higher transconductance. The channel layer 22 produced on substrate 21, e.g., by epitaxial growth or diffusion, has been rendered highly conductive by doping the region 26, e.g., $10^{19}$ carriers/cm.$^3$, between source electrode S and the immediate vicinity of the gate. The gate-drain resistance of zone 27 has also been reduced accordingly by epitaxial growth or diffusion. Although zone 27 does not have direct influence on the transconductance of the transistor, it can be advantageous. It is effective in reducing resistance-capacitance time constants and in reducing heat dissipation at high currents. Preferably, the transistor is also designed symmetrically in respect to source and drain. The high conducting zones 26 and 27 need not extend to the bottom of the channel.

An illustrative electrical circuit is provided to operate the Schottky-barrier transistor of FIG. 2. A similar circuit is suitable for operation of each embodiment of the invention. Referring to the N-channel transistor of FIG. 2 in the common source connection, a negative voltage input pulse S1 is applied to the gate electrode G. This causes an output current pulse S2 in the drain circuit. The drain is positively biased with respect to the source by a battery 30.

In addition to reducing the source gate resistance and the gate-drain resistance by high level doping of the major part of the respective regions, it is also desirable to have these regions extend as close as possible to the gate contact 24, e.g., 1 micron or closer. If the distances 28 and 29 vanish or become too small due to unavoidable tolerances in fabrication, electric breakdown to the gate can occur in these places. Such electric breakdown is impeded by the exemplary embodiments of the invention now to be described.

Figure 3:
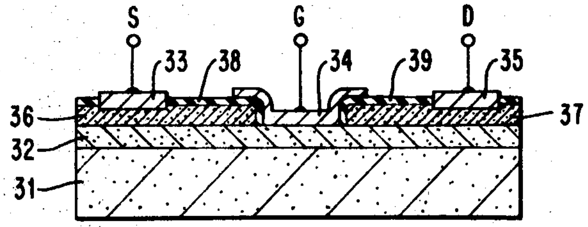
FIGS. 3, 4, and 5 are cross-sectional views of different embodiments of a Schottky-barrier field-effect transistor according to this invention.

In FIG. 3 a lightly doped channel layer 32, e.g., with $10^{15}$ to $10^{17}$ carriers/cm.$^3$, is arranged with illustrative thickness of approximately 0.5 microns on a substrate 31. A heavily doped layer, e.g., with $10^{19}$ carriers/cm.$^3$, is arranged on top of layer 32. An opening or a slot with the width of gate contact 34, typically 4 microns or smaller, is made into the heavily doped layer. This may be done by etching or by masking before epitaxially growing the layer. The layer is depicted by the hatched areas 36 and 37 which are highly conductive. Region 36 short circuits the low conductive channel layer 32 between source contact 33 and gate region 34. A similar short circuit is provided on the drain side. As the regions 36 and 37 should be well insulated from gate electrode 34, they are protected with insulation layers 38 and 39, e.g., of typically 5,000 angstrom units thick oxide. Source electrode 33 and drain electrode 35 are established in ohmic contact with highly conductive layers 36 and 37 through openings provided in the oxide layers 38 and 39. The gate electrode 34 is in direct contact with channel 32 and is arranged within the opening of layers 36 and 37 which are well protected by insulating oxide.

Exact alignment of different masks is not required for the fabrication of the embodiment described with reference to FIG. 3. Exact alignment of masks is usually required in the manufacture of semiconductor elements. Only one mask is used for etching the opening or the slot, respectively, required for gate electrode 34. For the production of the gate electrode 34, the requirements of mask alignment have desirable tolerance because the distance between the electrode and the high-conductive layers 36 and 37, respectively, depends only upon the thickness of oxide layers 38 and 39. Further, high precision in mask alignment is not required for fabrication of electrodes 33 and 35.

The oxide layers 38 and 39 must withstand normal operating voltages. The embodiment illustrated in FIG. 4 provides additional protection against electric breakdown.

Figure 4:
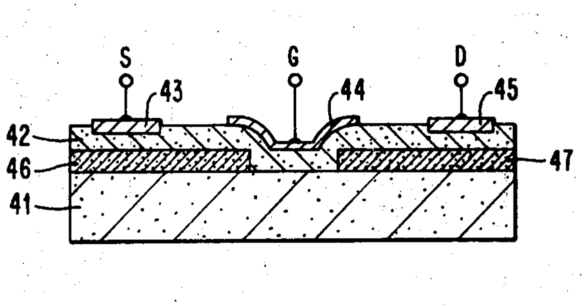

In the Schottky-barrier transistor of this invention illustrated in FIG. 4, a layer of heavily doped, e.g., $10^{19}$ carriers/cm.$^3$, and therefore highly conductive semiconductor material is arranged on a substrate 41. Either an opening or a slot, typically 4 microns or smaller in width, is made which has the width of the gate, leaving the hatched areas 46 and 47 which correspond to the areas 36 and 37 of FIG. 3. The lightly doped channel layer 42 with typical thickness of 0.5 microns, is grown epitaxially over the two short circuit layers 46 and 47. The source and drain electrodes 34 and 35, respectively, are in direct ohmic contact with channel layer 42; and gate electrode 44 is arranged as Schottky-barrier above the free zone between layers 46 and 47. The fabrication of this embodiment also does not require precise mask alignment, and it also does not require flawless insulation layers because channel layer 42 itself withstands breakdown. The resistance between electrodes 43 and 45 and high-conductive layers 46 and 47, respectively, is sufficiently low because layer 42 is very this in comparison to the area of the electrodes. The electrodes can be alloyed through the channel layer 42 to the high-conductive layers 46 and 47 if even lower contact resistance is desired.

Figure 5:
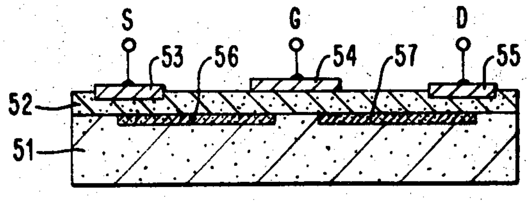

FIG. 5 illustrates an embodiment of this invention which is similar to the embodiment illustrated in FIG. 4 made completely by planar technology. The high-conductive zones 56 and 57 are inserted, e.g., by diffusion, into the substrate 51 which should preferably be a semiconductor. A lightly doped channel layer 52, e.g., with $10^{15}$ to $10^{17}$ carriers/cm.$^3$, is arranged on top of the substrate and source, gate, and drain electrodes 53, 54, and 55, respectively, are placed on layer 52 or in it. Precise alignment of the masks used for the sequential steps is not critical. Further, by use of the diffusion technique for establishing zones 56 and 57, it makes it relatively easy to reduce the size of the gate region between high-conductive layers 56 and 57. A small gate region is very desirable; and under some practical circumstances, the planar diffusion technique is better suited to meet this objective than the epitaxial technique.

Figure 6:
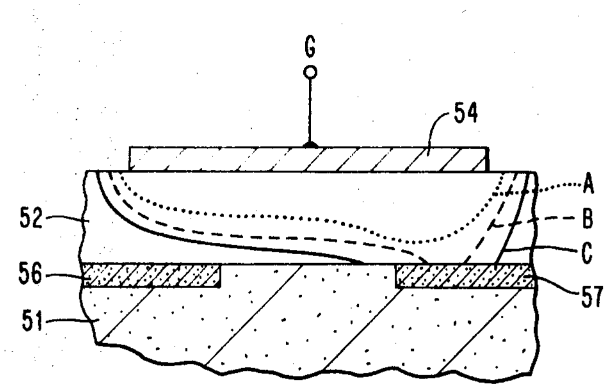
FIG. 6 is an enlarged partial view of FIG. 5 useful for explanation of the gate function.

FIG. 6 is presented for an explanation of operation of a transistor according to FIG. 5 and shown an enlarged view of gate contact 54, a part of channel layer 52 underneath, parts of the short circuit layers 56 and 57, and a part of substrate 51. A depletion zone is created in the gate region depending upon voltage applied to gate 54. At relatively low gate voltages, the depletion zone is about the shape of dotted curve "A," i.e., the depletion zone is unsymmetrical and depressed toward the drain which is effectively high-conductive zone 57. If the gate voltage is increased, the depletion zone increases accordingly and assumes the form of dashed line "B." The voltage is then big enough for the depletion zone to touch the highly conductive region 57. As the depletion zone is depressed toward the drain, it touches region 57 away from its end. Therefore, a current can still flow from either the source or the source zone 56 to the extreme end of drain zone 57. If the gate voltage is further increased, the depletion zone is increased accordingly; and it intersects layer 57 on an increasing area. Finally, the depletion zone becomes big enough to cover completely area 57 as shown by solid line "C." The current no longer increases with increasing applied source drain voltage. The corresponding applied gate voltage is termed the pinchoff voltage. Due to the presence of the depletion region, the current has to flow near the bottom of the channel. This demonstrates an advantage of the practice of this invention that without requiring precise alignment of the gate 54 with respect to regions 56 and 57, pinchoff can be obtained. Therefore, a reduction of the series resistance between source and gate region is more effectively realized if the high-conductive layer is arranged on the bottom of the channel layer as is shown in FIGS. 4, 5, 6, and 7 rather than on top of the channel layer as shown in FIGS. 3 and 8, respectively. However, these latter embodiments have other advantages.

The performance of a field-effect transistor is limited by its breakdown voltage between gate and drain. If a Schottky-barrier transistor of this invention according to FIG. 5 or 6, respectively, is operated with increasing voltage, a breakdown will finally result between gate electrode 54 and highly conductive layer 57 which is connected to the drain. The breakdown voltage of the transistor can be additionally increased by design as illustrated in FIG. 7.

Figure 7:
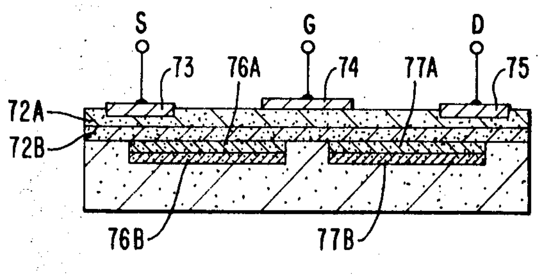
FIG. 7 is a cross-sectional view of a further variation of a transistor according to FIG. 5.

In FIG. 7 recesses are made into a substrate 71 to receive highly conductive layers **76*b* and 77*b*, e.g., doped with $10^{19}$ carriers/cm.$^3$, which might correspond generally to layers 56 and 57 or FIGS. 5 and 6. The layers 76*b* and 77*b* are epitaxially grown into the recesses but only partially fill them. The recesses are then completely filled by second epitaxially grown layers 76a and 77a of considerably lower doping level than layers 76b and 77b, e.g., approximately an order of magnitude lower. The resulting plane surface is then covered with channel layer 72b. On top of channel layer 72b there is another layer 72a which is also part of the channel but which has a lower doping level than layer 72b. Therefore, on top of the highly conductive layers 76b and 77b there is established a low-conductive intermediate layer which in turn is covered by the low-conductive channel layer 72b. This is also covered at least within the gate region by a particularly low-conductive upper channel layer 72a. Since there is a relationship between the doping level of the channel layer and the voltage required for pinchoff on one side, as well as between this doping level and the breakdown voltage of a layer on the other side, it is possible by sandwiching layers of different doping level to increase the breakdown voltage without substantially increasing the voltage required for pinchoff. The effect can be improved additionally by a subdivision of the channel into layers 72a and 72b where layer 72a has lower doping level than layer 72**b. The sandwich design permits a number of very interesting variations which will be apparent to those skilled in the art. It is easily possible for a certain application to emphasize certain characteristics of a transistor without impairing significantly other characteristics. In particular, the breakdown voltage between gate and drain, the transconductance, the high frequency behavior of the transistor, as well as the capacity between gate and drain may be influenced by skillful choice of doping level of each of the different layers.

The ohmic contacts for source and drain are usually large in area compared with the thickness of the layers underneath, e.g., in the order of a few tenths of micron. The resistance between these contacts and the highly conductive layers is usually sufficiently low. However, for certain applications, it may be necessary to reduce further this resistance. This can be done easily by having the ohmic contacts extend through the adjacent layers into the highly conductive layer.

Figure 8A:
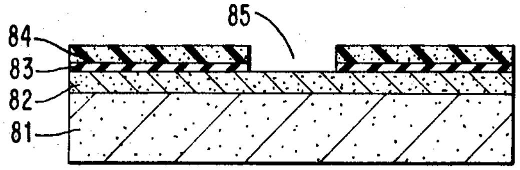
FIGS. 8A, 8B, and 8C illustrate the steps of a procedure of this invention for manufacturing the transistor illustrated by FIG. 2.
Figure 8B:
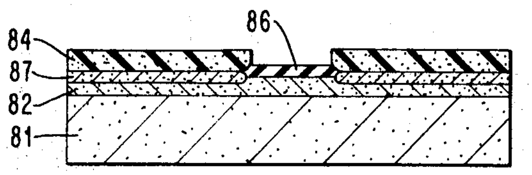

The embodiments described in connection with FIGS. 1 and 2 as well as 4 through 7 are advantageously covered on all sides, or at least on the side bearing the contact leads, with oxide, not shown. This prevents contamination and is easily accomplished by those skilled in the art. A manufacturing method will now be explained which is particularly suitable for manufacture of the embodiment of this invention of a Schottky-barrier transistor described above in connection with FIG. 3. The manufacturing method is generally useful in the manufacture of semiconductor devices and of other types of field-effect transistors, particularly those using silicon for the conductive channel controlled by the gate electrode. FIG. 8A illustrates a semiconductor substrate 81 on which a lightly doped channel layer is established, e.g., N-type Si with a carrier concentration of $10^{15}$ to $10^{17}$ atoms/cm.$^3$. A thin silicon dioxide layer 83 with typical thickness of 300 angstrom units is first produced on top of channel layer 82. This layer consists preferably of pure, i.e., undoped, silicon dioxide produced in a conventional manner, e.g., oxidation of the silicon channel surface in oxygen or water vapor atmosphere. On top of the layer 83 of pure oxide there is established a second layer 84 consisting of heavily doped oxide, with a typical thickness of 6,000 angstrom units, e.g., silicon dioxide doped with a few atomic percent of phosphorus. Next, an opening or a gap is made for the gate in the oxide layers 84 and 83, e.g., by etching. Pure silicon dioxide is thermally grown in the gap which limits lateral diffusion of the phosphorus under the gate electrode. The material from layer 84, i.e., phosphorus, is then diffused through the pure thin oxide layer 83 into the silicon semiconductor material constituting the channel layer 82. The procedure for fabricating the Schottky-barrier transistor of FIG. 8C will now be described in greater detail. In the present procedure, an atmosphere of water vapor is first used which causes fast growth of an essentially undoped oxide layer 86 within the opening 85 on the open surface of channel layer 82. It has been discovered that oxide 86 undergrows layer 84 sideways about 1$\mu$ as illustrated in FIG. 8B. The growth of oxide is stopped as soon as layer 86 has reached a sufficient thickness, e.g., typically 3,000 A. The stopping is done by replacing the vapor atmosphere by pure oxygen. During further heat treatment, the oxide layer continues to grow very slowly. However, the diffusion of doping material (phosphorus) from layer 84 through layer 83 now builds up the highly doped semiconductor layer 87. The important point here is that the lateral phosphorus diffusion is inhibited by the laterally grown wedge-shaped pure silicon dioxide. The purpose of the pure oxide layer 83 is to cause a time delay in the diffusion process to allow the growth of relatively pure oxide before a considerable amount of doping material has arrived in the semiconductor layer 82. The mode and the amount of undergrowth of oxide layer 86 underneath the doped oxide layer 84 can easily be observed by means of the known interference measurement for thickness of transparent thin films in a wedge cut.

At this time, between the diffusion procedure and deposition of the gate electrode, the electrodes for source and drain are applied by conventional techniques.

Figure 8C:
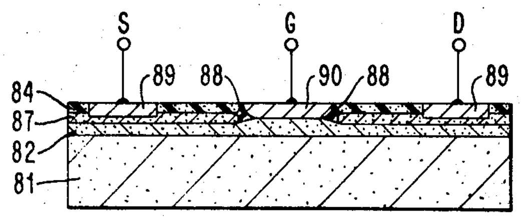

Before deposition of the gate electrode, the entire oxide surface which consists of layers 84 and 86 is etched, for which masking is not required. The etching is interrupted as soon as oxide layer 86 is removed from the desired gate contact surface and channel layer 82 is uncovered. Although the etching reduces the thickness of layer 84, this does not affect negatively the operation of the device. The etching process only removes layer 86 where it has not undergrown the heavily doped layer 84. Gate electrode 90 is then deposited on undoped channel layer 82, and it is well separated on all sides from highly conductive zones 87 as illustrated in FIG. 8C which is very desirable in order to prevent breakdown between gate and the highly conductive zones. To make FIG. 8C clear, the size of the regions 88 is exaggerated.

Throughout the procedure for fabrication of the Schottky-barrier transistor of FIG. 8C, only moderate requirements are imposed for precision of mask alignment. Only one mask is required to produce the gate opening 85. The number of masks required to produce electrodes 89 and 90 in a conventional manner does not exceed two. The position of the masks with reference to the position of the mask for the gate opening is not critical because the metallization of the electrode 90 somewhat overlaps oxide layer 84. Further, the position of electrodes 89 is not critical.

SUMMARY

Generally, the Schottky-barrier transistor of this invention may be made of such semiconductor materials as germanium, silicon, or gallium arsenide, etc. However, the embodiment described with reference to FIGS. 8A, 8B, and 8C should preferably be made of silicon. The insulating layers preferably consist of silicon dioxide. The substrate may consist of the same or of a different semiconductor as the active layers, but it should be either semiinsulating or of opposite conductivity type as the active layers. It may also consist of an insulating material, e.g., sapphire.

The prior art discovery that the crystal material has different growth rates during epitaxy in different crystallographic directions may be used for epitaxial growth of layers as described above for some embodiments, e.g., FIGS. 3 and 4. This minimizes any undesired transition effects between layers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A Schottky-barrier transistor comprising:

a substrate;

a source having a relatively high-conductivity region supported by said substrate and having a source electrode electrically connected thereto;

a drain having a drain region supported by said substrate and a drain electrode electrically connected thereto, said drain electrode being spaced from said source electrode, said drain region being spaced from said source region;

an intermediate semiconductor region supported by said substrate located between said source and drain regions and having lower conductivity than said source region, said intermediate semiconductor region extending over said high-conductivity source region, said intermediate region and extended portions thereof consisting of at least two layers of different conductivities; and a Schottky-barrier gate electrode located on said intermediate semiconductor region spaced from said source electrode and said drain electrode for electrically influencing said conductivity of said intermediate region.

2. A Schottky-barrier transistor comprising:

a substrate;

a source having a relatively high-conductivity semiconductor region of a given conductivity type supported by said substrate and having a source electrode electrically connected thereto, said high-conductivity source region consisting of two layers of different conductivities;

a drain having a drain region supported by said substrate and a drain electrode electrically connected thereto, said drain electrode being spaced from said source electrode, said drain region being spaced from said source region;

an intermediate semiconductor region of said given conductivity type supported by said substrate located between said source and drain regions and having lower conductivity than either of said two layers of said source region, said intermediate semiconductor region extending over said high-conductivity source region; and a Schottky-barrier gate electrode located on said intermediate semiconductor region spaced from said source electrode and said drain electrode for electrically influencing said conductivity of said intermediate region;

whereby the breakdown voltage between said gate and said drain is increased.

3. A Schottky-barrier transistor comprising:

a substrate;

a source having a relatively high-conductivity semiconductor region of a given conductivity type supported by said substrate and having a source electrode electrically connected thereto;

a drain having a relatively high-conductivity semiconductor region of the same conductivity type of said source, said source semiconductor region supported by said substrate and having a drain electrode electrically connected thereto, said drain electrode being spaced from said source region;

an intermediate semiconductor region of said given conductivity type supported by said substrate located between said source and drain electrodes and having lower conductivity than said source semiconductor region, said intermediate semiconductor being contiguous to and separating said substrate from said high-conductivity source and drain regions and extending between said high-conductivity source and drain regions and said high-conductivity drain and source regions being doped zones of said extended portions of said intermediate region;

a Schottky-Barrier gate electrode located on said intermediate semiconductor region spaced from said source electrode and said drain electrode for electrically influencing said conductivity of said intermediate region; and insulating means located on said intermediate semiconductor region on spaces between said source and gate electrodes and between said drain and gate electrodes comprising, a first insulating layer between said high conductivity regions and said gate electrode, said first layer having an undergrown region, and a second insulating layer filling in said undergrown region.

(5/69)

CERTIFICATE OF CORRECTION

Patent No. 3,609,477 Dated September 28, 1971

Inventor(s) Karsten E. Drangeid, Horst F. Statz, Theodor O. Mohr, Waldemar Von Muench It is certified that error appears in the above-identified patent and that said Letters Patent are hereby corrected as shown below:

Column 2, line 57, the expression "$g_m=g_0/(1a8+g_0 R_s)$" is written incorrectly. It should read as follows:

--$g_m = \frac{g_0}{1 + g_0 R_s}$--.

Column 2, line 61, after "A." delete the two o's. (oo).

Signed and sealed this 25th day of July 1972.

(SEAL)
Attest:

EDWARD M.FLETCHER,JR.
Attesting Officer

ROBERT GOTTSCHALK
Commissioner of Patents